United States Patent
Orio

(10) Patent No.: US 7,886,209 B2
(45) Date of Patent: Feb. 8, 2011

(54) DECODING DEVICE, DECODING METHOD, AND RECEIVING APPARATUS

(75) Inventor: Masao Orio, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 1063 days.

(21) Appl. No.: 11/622,780

(22) Filed: Jan. 12, 2007

(65) Prior Publication Data

US 2007/0180351 A1 Aug. 2, 2007

(30) Foreign Application Priority Data

Jan. 17, 2006 (JP) ............................. 2006-008198

(51) Int. Cl.
*H03M 13/00* (2006.01)
(52) U.S. Cl. ................ 714/755; 714/786; 714/794; 714/795; 375/262; 375/341
(58) Field of Classification Search ............... 714/755, 714/786, 794–795; 375/341, 262
See application file for complete search history.

(56) References Cited

U.S. PATENT DOCUMENTS

| | | | | |
|---|---|---|---|---|
| 6,888,901 | B2 * | 5/2005 | Yu et al. ............... | 375/341 |
| 6,915,474 | B2 * | 7/2005 | Taguchi ............... | 714/755 |
| 7,020,209 | B1 * | 3/2006 | Okumura ............. | 375/253 |
| 7,460,610 | B2 * | 12/2008 | Matsumoto ......... | 375/285 |

FOREIGN PATENT DOCUMENTS

| | | |
|---|---|---|
| JP | 2000-216689 A | 8/2000 |
| JP | 2002-100995 A | 4/2002 |
| JP | 2002-344330 A | 11/2002 |
| JP | 2004-194326 A | 7/2004 |
| JP | 2004-254348 A | 9/2004 |

OTHER PUBLICATIONS

A Taffin, "Generalized stopping criterion for iterative decoders", IEEE Electronics Letters, Jun. 26, 2003, vol. 39, No. 13.
U.S. Appl. No. 11/590,823, filed Nov. 1, 2006.

* cited by examiner

*Primary Examiner*—Guy J Lamarre
(74) *Attorney, Agent, or Firm*—Sughrue Mion, PLLC

(57) ABSTRACT

A decoding apparatus includes a first decoder and a second decoder as a decoding processor for performing iterative decoding on received data, a hard decision section for calculating hard decision results based on logarithmic likelihood ratios $L_1$ and $L_2$ from the first and second decoders, and a stop determination section performing stop determination on whether or not to stop the iterative decoding on the received data based on the result of the hard decision section. The decoding apparatus completes one-time iterative decoding by executing decoding process in each of the first and second decoders. The stop determination section executes stop determination at the timings of completion of the decoding process in the first decoder and completion of the decoding process in the second decoder.

18 Claims, 10 Drawing Sheets

RELATED ART

DECODING DEVICE, DECODING METHOD, AND RECEIVING APPARATUS

BACKGROUND OF THE INVENTION

1. Field of the Invention

The present invention relates to a decoding device, a decoding method, and a receiving apparatus which decode received data based on likelihood information, and particularly, to a decoding device, a decoding method, and a receiving apparatus which perform a decoding process with improved efficiency.

2. Description of Related Art

In a digital communication system, error correcting codes for correcting an error which occurs on a transmission line are used. Particularly in a mobile communication system where radio field intensity varies drastically due to fading and an error is likely to occur, a high correction capability is required for error correcting codes. Turbo codes, which are one example of error correcting codes, are notable as the codes having the error correction capability which is close to the Shannon limit and employed in the W-CDMA (Wideband Code Division Multiple Access) or CDMA-2000 as the third-generation mobile communication system, for example.

FIG. 7 is a block diagram showing the structure of a typical encoding device for generating turbo codes. The encoding device 101 may be placed on the transmitting side of a communication system in order to encode information bits (systematic bits: systematic portion) U as pre-encoded data into turbo codes as parallel concatenated convolutional codes (PCCCs) and output the turbo codes to outside such as a transmission line. The turbo codes are not limited to the parallel concatenated convolutional codes and may be any codes which can be turbo-decoded, such as serial concatenated convolutional codes.

The encoding device 101 includes a first encoder 102, a second encoder 103 which serve as a systematic convolutional coder, and an interleaver 104 which interleaves (i.e. rearranges) data as shown in FIG. 7.

The first encoder 102 encodes input systematic portion U to generate redundancy bits (hereinafter as "parity bits") 1P and outputs the parity bits 1P to outside. The interleaver 104 rearranges each bit of the input systematic portion U into a prescribed interleaved pattern to generate a systematic portion $U^{int}$ and outputs the generated systematic portion $U^{int}$ to the second encoder 103. The second encoder 103 encodes the systematic portion $U^{int}$ to generate parity bits 2P and outputs the parity bits 2P to outside.

In sum, the encoding device 101 generates the systematic portion U, the parity bits 1P, the systematic portion $U^{int}$, and the parity bits 2P. A pair of the systematic portion U and the parity bits 1P (U, P) is called a first elemental code E, and a pair of the systematic portion $U^{int}$ and the parity bits 2P ($U^{int}$, 2P) is called a second elemental code $E^{int}$.

Decoding such encoded turbo codes is called turbo decoding. In the turbo decoding process, decoding is performed repeatedly as a first decoder for decoding the first elemental code E and a second decoder for decoding the second elemental code $E^{int}$ exchange external information. The number of decoders is not limited to two, and two or more stages of decoders may be used in accordance with the number of elemental codes of the turbo codes.

Specifically, in the turbo decoding process, the parity bits 1P, channel values $Y_{1p}$ and $Y_s$ of the systematic portion U, and a predetermined value (external information) $L_{e2}$ are input to a first decoder as the first stage decoder to obtain external information $L_{e1}$. An initial value of the external information $L_{e2}$ is 0. In order to align the data sequence, the external information $L_{e1}$ is rearranged by an interleaver into external information $L^{int}_{e1}$ to be input to a second decoder as the second stage decoder.

Further, the channel value $Y_s$ is rearranged by an interleaver into $Y^{int}_s$. The channel value $Y_{2P}$ of the parity bits 2P and the interleaved $Y^{int}_s$ are input to the second decoder to obtain external information $L^{int}_{e2}$. These values are rearranged by a de-interleaver so that the data sequence is the same as the data from the first decoder to thereby obtain external information $L_4$ for the first decoder. This is repeated a plurality of times.

In this way, the process decodes information by repeatedly exchanging reliability information of the first and second decoders each other i.e. using reliability information (external information $L_{e1}$) of the first decoder to enhance reliability information of the second decoder and using reliability information (external information $L_{e2}$) of the second decoder to enhance reliability information of the first decoder. Such iterative operation is called "turbo decoding" because it resembles a turbo engine of automobiles.

In such iterative decoding, it is critical when to stop the iterative decoding while maintaining a high decoding capability in order to reduce power consumption of a decoder and decoding time. Techniques for stopping the iterative decoding using various stop conditions are disclosed in Japanese Unexamined Patent Application Publications Nos. 2004-194326, 2002-344330, and 2002-100995.

As an example of stopping the iterative decoding, a method of stopping turbo decoding using HDA (Hard-Decision Aided) is described hereinafter. The HDA is a stopping method for an iterative process which uses a rate of bits which are "0"/"1" inverted from the previous iteration for HD (Hard Decision) in each iterative process in the turbo decoding. The smaller rate of inverted bits indicates that the decoding process is coming to convergence or an end. Originally, HDA is used in order to end the iterative decoding of turbo codes by detecting that no error occurs. For example, the turbo decoding process can be ended when a value of HDA falls below a prescribed threshold.

A decoding device which uses HDA not only for the detection of convergence but also for the detection of non-convergence in the decoding process to thereby optimize the number of times of iteration of turbo decoding is disclosed in A. Taffin, "Generalized stopping criterion for iterative decoders", IEEE Electronics Letters, 26 Jun. 2003, Vol. 39, No. 13. FIG. 8 is a block diagram which depicts a decoding device taught by Taffin. A decoding device 201 includes a first decoder 202, a second decoder 203, interleavers 204 and 205, de-interleavers 206 and 207, a hard decision section 208, and a HDA determination section 209.

The decoding device 201 receives turbo codes which are transmitted through a transmission line as received data. The received data contain the first elemental code E and the second elemental code $E^{int}$. The elemental codes E and $E^{int}$ are composed of parity bits 1P and 2P and systematic bits U and $U^{int}$ as described earlier. The systematic bits $U^{int}$ of the second elemental code $E^{int}$ can be obtained by interleaving the systematic bits U of the first elemental code E. Thus, the actually transmitted data contain the systematic bits U and the parity bits 1P of the first elemental code E and the parity bits 2P of the second elemental code $E^{int}$.

The first decoder 202 and the second decoder 203 perform iterative decoding of the received data by soft-input soft-output decoding. SOVA (Soft-Output Viterbi Algorithm) and MAP (Maximum A Posteriori) are known as the soft-input soft-output decoding.

The first decoder 202 receives the received first elemental code E (first parity $Y_{1p}$, systematic bits $Y_s$) and external information $L_{e2}$, performs decoding, and outputs first external information $L_{e1}$. The interleaver (int) 204 interleaves the first external information $L_{e1}$ to generate interleaved first external information $L^{int}_{e1}$. At the same time, the interleaver 205 interleaves the systematic bits $Y_s$ to generate interleaved systematic bits $Y^{int}_s$, which is then supplied to the second decoder 203.

The second decoder 203 receives the interleaved first external information $L^{int}_{e1}$, the received second parity $Y_{2p}$, and the interleaved systematic bits $Y^{int}_s$, performs decoding, and outputs second external information $L^{int}_{e2}$. The second external information $L^{int}_{e2}$ is then de-interleaved by the de-interleaver 206 and supplied to the first decoder 202. The first decoder 202 decodes the second external information $L_{e2}$. The above process is repeated subsequently. One-time iterative decoding ends upon completion of the decoding process in the first decoder 202 and the second decoder 203.

The second decoder 203 calculates logarithmic likelihood ratio $L^{int}_2$ and outputs it to the de-interleaver 207. The de-interleaver 207 de-interleaves the logarithmic likelihood ratio $L^{int}_2$ into logarithmic likelihood ratio L, and then the hard decision section 208 determines a hard decision result. In the decoding device 201, the hard decision result is supplied to the HDA determination section 209, which then determines whether or not to stop the iterative process of turbo decoding.

The HDA determination section 209 compares the BER which is calculated by HDA and the information length rate with thresholds and determines convergence/non-convergence of turbo codes to thereby optimize the iterative number of turbo decoding.

FIG. 9 is a flowchart showing a decoding method in the decoding device 201. As shown in FIG. 9, the number of times of iterative decoding to be performed in the first decoder 202 and the second decoder 203, which is referred to hereinafter as the iterative number, is set to 1, and an upper limit of the iterative number is set to 8 (Step S101). Then, the first decoder 202 performs decoding to generate first external information $L_{e1}$ (Step S102). The interleaver 204 interleaves the first external information $L_{e1}$ and supplies the result to the second decoder 203. At the same time, the interleaver 205 interleaves the systematic bits $Y_s$ and supplies the result to the second decoder 203. Although the first decoder 202 also generates a logarithmic likelihood ratio (LLR) $L_1$, it is not used herein. An initial value of an input $L_{e2}$ to the first decoder 202 is 0.

The second decoder 203 outputs the interleaved second external information $L^{int}_{e2}$ and the interleaved logarithmic likelihood ratio $L^{int}_2$. The interleaved second external information $L^{int}_{e2}$ is de-interleaved by the de-interleaver 206 into second external information $L_{e2}$ to be input to the first decoder 202. The interleaved logarithmic likelihood ratio $L^{int}_2$ is de-interleaved by the de-interleaver 207 into logarithmic likelihood ratio $L_2$ and then input to the hard decision section 208 where a hard decision result is generated.

After that, it is determined whether the iterative number exceeds 1 or not (Step S104) and, if the iterative number is equal to or more than 2, a determination value $\Delta_0$ is calculated as the following Expression 1 (Step S105).

$$\Delta_0 = \frac{1}{N}\sum_{k=0}^{N-1} |\hat{u}_k(L_2^i) - \hat{u}_k(L_2^{i-1})| \quad (1)$$

where k indicates a bit identifier in block, i indicates an iterative number, N indicates a block length, û() indicates a hard decision result, $L_2$ indicates a logarithmic likelihood ratio LLR of the second decoder, and $\Delta_0$ indicates a ratio of differences in hard decision results.

Thus, the determination value $\Delta_0$ indicates a ratio of differences between a hard decision result of the current logarithmic likelihood ratio $L_2$ and a hard decision result of the previous logarithmic likelihood ratio $L_2$ for each bit. If the determination value $\Delta_0$ approximates 0, the current and previous decoding results are equal. If the determination value $\Delta_0$ approximates 1, the current and previous decoding results differ largely.

If the determination value $\Delta_0$ is larger than a convergence determining threshold $\eta_{conv}$ or smaller than a non-convergence determining threshold $\eta_{non-conv}$ (No in Step S106), the iterative decoding is performed until the iterative number reaches MAX=8. Thus, the process determines whether or not the iterative number reaches MAX=8 (Step S107) and, if it is less than 8, it increments the iterative number (Step S108) and repeats the procedure from Step S102.

For the determination of the determination value $\Delta_0$ in Step S106, when the iterative number is 2 or above, the determination value $\Delta_0$ is calculated by Expression 1 using a hard decision result û. Then, a stopping criteria is determined from the convergence determining threshold $\eta_{conv}$ and the non-convergence determining threshold $\eta_{non-conv}$. If the determination results in that either of convergence/non-convergence condition is satisfied, the iterative decoding is stopped.

Advantages of such a conventional decoding device which controls the stopping of the iterative decoding using the non-convergence determination in addition to the convergence determination are described below. FIG. 10 is a graph showing the relationship between a noise and an error rate. The vertical axis indicates a block error rate (BLER) and a bit error rate (BER). The horizontal axis indicates a signal-to-noise power density ratio $E_b/N_0$ (dB). FIG. 11 is a view showing the relationship of the iterative number with respect to a signal-to-noise power density ratio.

In FIGS. 10 and 11, the signal-to-noise power density ratio $E_b/N_0$ (dB) in the horizontal axis is such that a larger value indicates a smaller noise. The BLER in the vertical axis is calculated by counting a block which contains one or more bit error as an error, and BER indicates a value (%) that is a result of dividing the number of error bits by 954 bits (encoding block size).

In FIG. 10, (OFF, OFF) indicates the case where convergence or non-convergence is not performed, and (2%, OFF) indicates the case where the iterative stop control is performed only by the convergence determination with the convergence determining threshold $\eta_{conv}$=2%. (OFF, 20%) indicates the case where the iterative stop control is performed only by the non-convergence determination with the non-convergence determining threshold $\eta_{non-conv}$=20%, and (2%, 20%) indicates the case where the iterative stop control is performed by the convergence/non-convergence determination with the convergence determining threshold $\eta_{conv}$=2% and the non-convergence determining threshold $\eta_{non-conv}$=20%.

The simulation conditions are as follows. The transmitting-side conditions involve the Rate 1/3(15, 13)$_8$ PCCC turbo encoder, the 2-stage rate-matching, and the parallel bit level channel interleaver. The modulation method is the 16 QAM constellation and the conventional Gray mapping. The code block size is fixed to 954 bits (938 systematic bits and 16 CRC bits).

The parity bits are ½ punctured. Thus, 1920 bits are transmitted at intervals of 2 ms. The fading condition is 50 km/h on a single path. The receiving-side conditions involves no RAKE synthesis due to the single path, soft-output of Max-Log-MAP, and the maximum iterative number of 8 times, and Hybrid-ARQ being invalid.

Under the above conditions, BLER and BER are smaller as a noise is lower as shown in FIG. 10. Further, the iterative number is smaller as the noise is lower as shown in FIG. 11. Where BLER=10% ($E_b/N_0$=16 dB), an average iterative number is about 2.25. This reduces more than 70% of processing compared with the case where the iterative number is fixed to 8. With the convergence determination at a threshold of 2%, an average iterative number is about 2.8. Therefore, the stop control with convergence/non-convergence determination leads to about 20% reduction of processing compared with the stop control with convergence determination only.

Although a conventional decoding device is described above by way of illustration, various iterative control methods are proposed as described in the above-described patent documents and Taffin. FIG. 12 shows the summary of these techniques. FIG. 12 is a view depicting the iterative control methods and the number of iterations according to several related arts. The iterative control method employed in the decoding device taught by Taffin corresponds to the related art D. This iterative control method is an improved version of the iterative control method corresponding to the related art C below. The correspondence in FIG. 12 is as follows.

Related Art A: Where the iterative number is fixed (e.g. 8 Times)
  A1: The decoding is iterated 8 times if an error cannot be corrected after completing 8 times of iteration.
  A2: The decoding is iterated until reaching a fixed upper limit (8 times) even if an error is corrected before completing 8 times of iteration.

Related art B: Where the determination whether an error exists or not is performed using error detecting codes until reaching a maximum iterative number (e.g. 8 times) and the iterative process is stopped if there is no error.
  B1: When there is no error detecting code, decoding is iterated 8 times if an error cannot be corrected after completing 8 times of iteration (=A1).
  B2: When there is no error detecting code, decoding is iterated 8 times even if an error is corrected before completing 8 times of iteration.
  B3: When there are error detecting codes, decoding is iterated 8 times if an error cannot be corrected after completing 8 times of iteration.
  B4: When there are error detecting codes, iterative process is stopped if an error is corrected before completing 8 times of iteration.

Related art C: Where the determination on convergence of error correction is performed until reaching a maximum iterative number (e.g. 8 times) and the iterative decoding is stopped if it is determined that the error correction is converged.
  C1: The decoding is iterated 8 times if convergence of error correction is not detected after completing 8 times of iteration.
  C2: The iterative process is stopped if convergence of error correction is detected before completing 8 times of iteration.

Related art D: Where determination on non-convergence of error correction is added to the above case C, and the iterative decoding is stopped if it is determined that the error correction is not converged even after reaching a maximum iterative number.
  D1: The decoding is iterated 8 times if convergence/non-convergence of error correction is not detected after completing 8 times of iteration.
  D2: The iterative process is stopped if non-convergence of error correction is detected before completing 8 times of iteration.
  D3: The iterative process is stopped if convergence of error correction is detected before completing 8 times of iteration.

As described in the foregoing, the related art D corresponding to the decoding device taught by Taffin overcomes the drawback in the related art C, that is, the decoding is undesirably iterated 8 times even if the error correction is not converged even after completing 8 times of iteration (the case C1). By performing the determination on non-convergence in addition to the determination on convergence, the iterative process can be stopped if non-convergence is determined before reaching a maximum iterative number of 8 times as shown in D2 of the related art D. This prevents unnecessary iterative process. The use of convergence/non-convergence determination enables the iterative control of turbo codes to thereby optimize the iterative number.

However, the above related arts perform stop determination upon completion of iterative decoding. Particularly, if there are a large amount of codes to be decoded or if a decoder is composed of two or more stages, it takes time to perform a one-time iterative decoding process. It is therefore preferred to perform the stop determination as fast as possible while maintaining the accuracy of the stop determination.

SUMMARY OF THE INVENTION

According to one aspect of the present invention, there is provided a decoding device that decodes received data based on likelihood information, including a decoding processor to function as a plurality of stages of decoders and performing iterative decoding on the received data, and a stop determination section performing stop determination on whether or not to stop the iterative decoding based on an output result from the decoding processor. The decoding processor completes one-time iterative decoding by executing first to final stages of decoding process. The stop determination section executes the stop determination at the timing of completion of decoding process before the final stage.

According to another aspect of the present invention, there is provided a decoding method that decodes received data based on likelihood information, including performing iterative decoding on the received data by a decoding processor functioning as a plurality of stages of decoders and completing one-time iterative decoding by executing first to final stages of decoding process, and performing stop determination on whether or not to stop current iterative decoding based on a result of decoding process before the final stage in the decoding processor presently executing current iterative decoding.

According to the present invention, the stop determination is performed upon completion of decoding process prior to the final stage, not upon each completion of iterative decoding as in the related arts, thereby performing the stop determination at a more precise timing to enable an iterative decoding process to stop earlier as needed. Performing the stop determination for an iterative decoding process at a timing earlier than the completion of the iterative decoding process enables optimization of the number of times of iterative processing to increase efficiency.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary embodiments of the present invention are described hereinafter with reference to the accompanying drawings. In the following embodiments, the present invention is applied to a decoding device for turbo decoding and a receiving apparatus including the same. It performs stop determination for iterative decoding at a timing earlier than the completion of the iterative decoding process to thereby eliminate an unnecessary iterative decoding process compared with related arts.

First Embodiment

Figure 1:
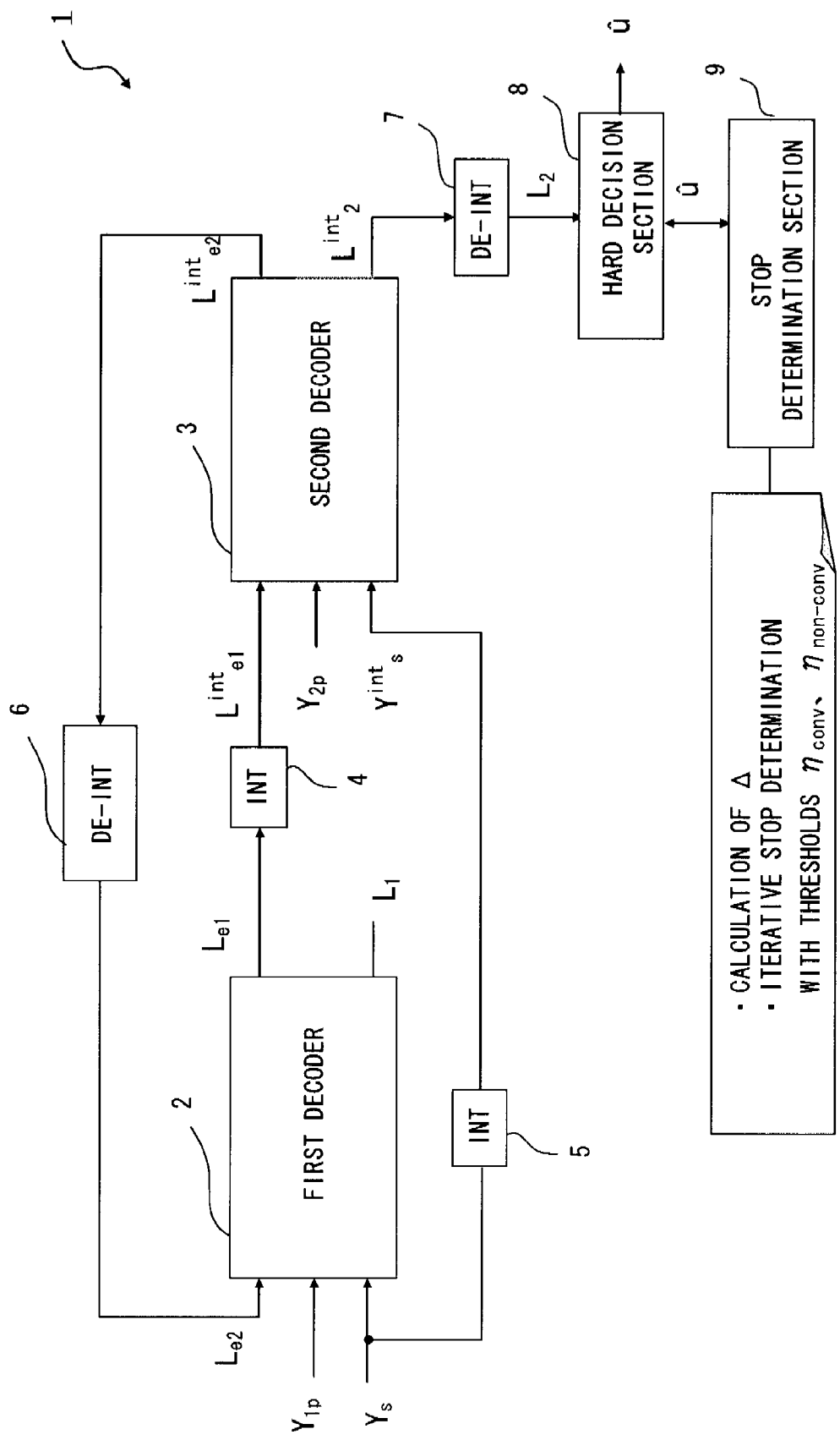
FIG. 1 is a view showing a decoding device according to a first embodiment of the present invention.

FIG. 1 is a view showing a decoding device 1 according to a first embodiment of the present invention. The decoding device 1 includes a first decoder 2, a second decoder 3, interleavers 4 and 5, de-interleavers 6 and 7, a hard decision section 8, and a stop determination section 9.

Figure 10:
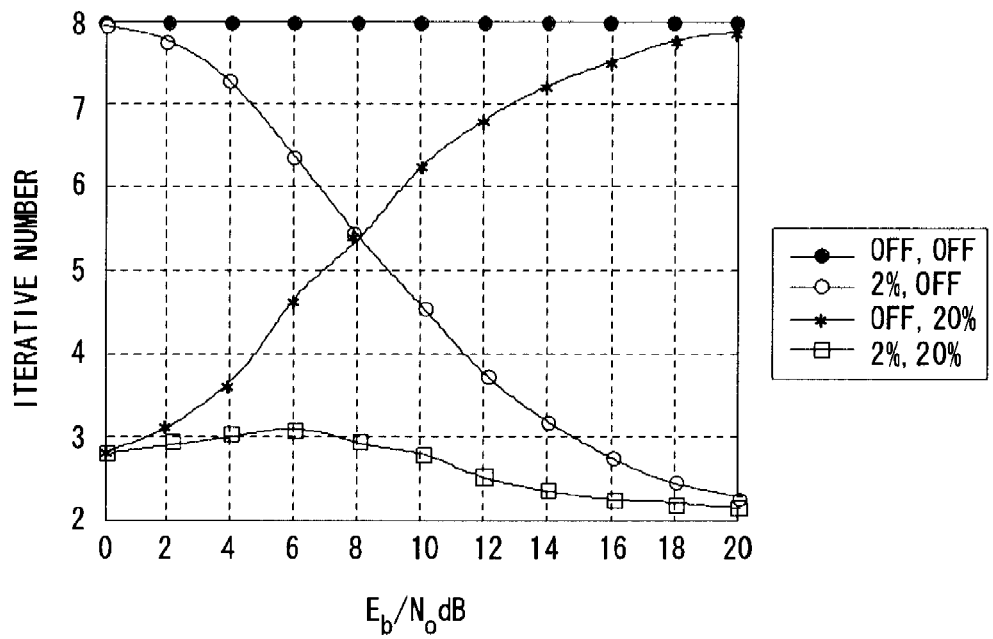
FIG. 10 is a graph showing the relationship between a noise and an error rate in a decoding device according to a related art, with the vertical axis indicating a block error rate (BLER) and a bit error rate (BER) and the horizontal axis indicating an error rate.
Figure 11:
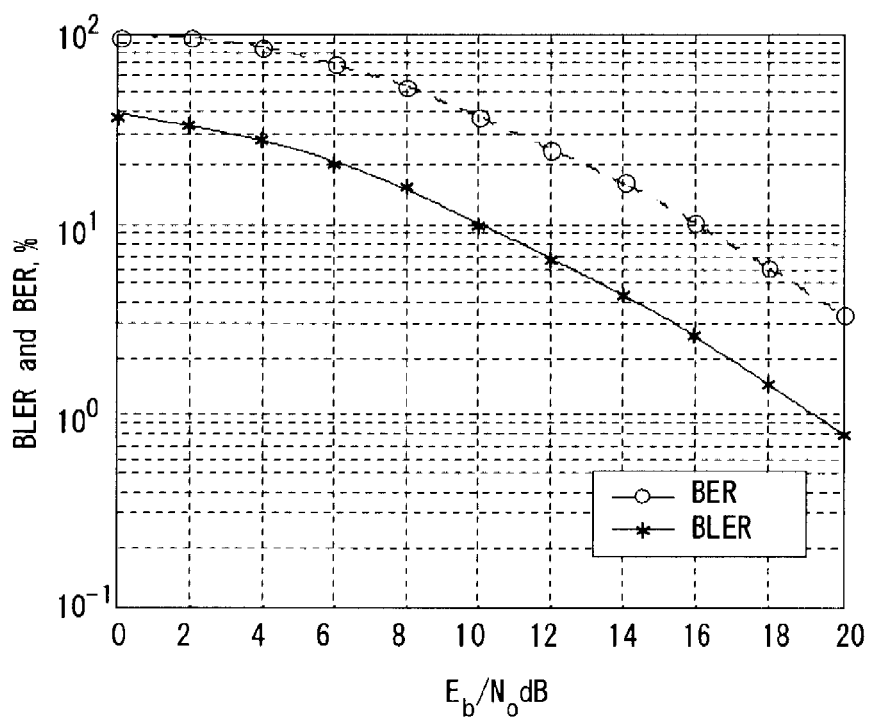
FIG. 11 is a graph showing the relationship between a noise and an iterative number in a decoding device according to a related art.
Figure 12:
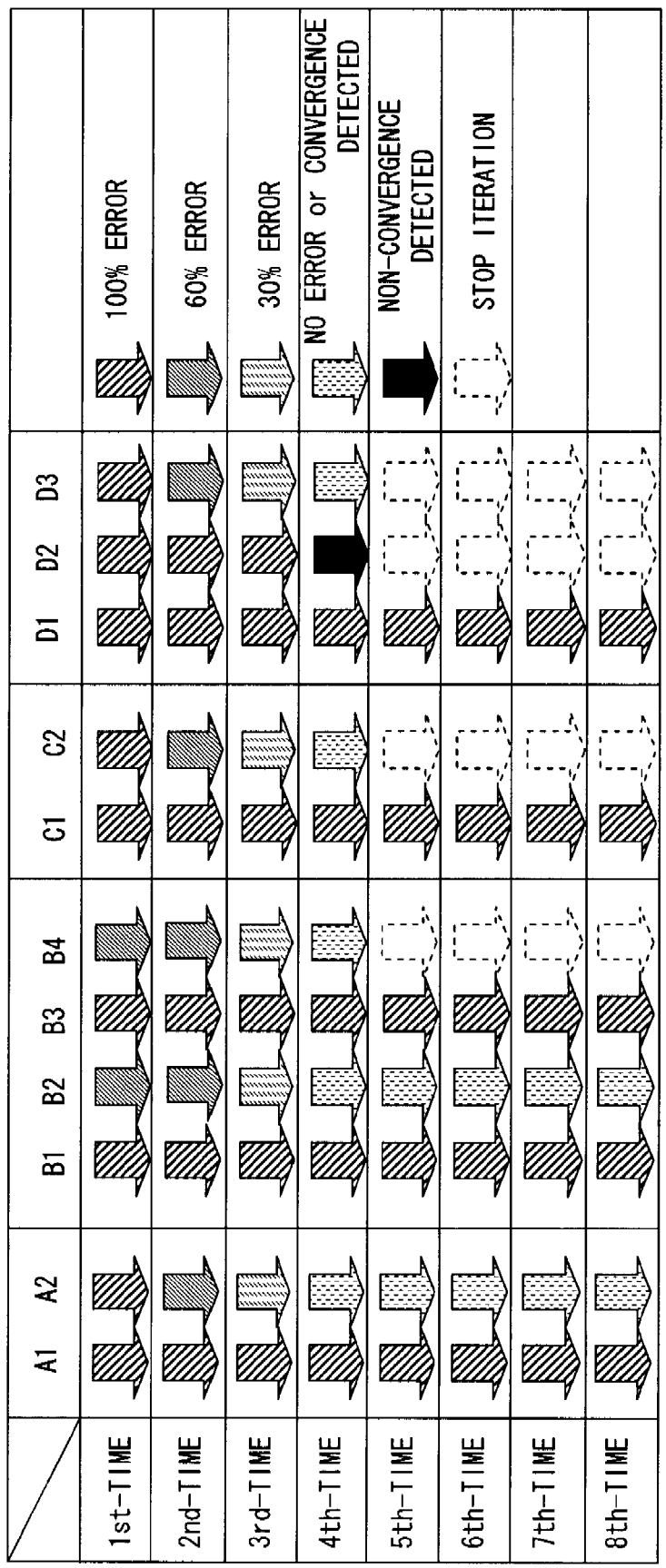
FIG. 12 is a view showing an iterative control method and an iterative number according to a related art.

The decoding device 1 receives turbo codes as received data which are transmitted through a transmission line. The received data contains a first elemental code E and a second elemental code $E^{int}$ which may be generated by an encoding device as shown in FIG. 10. The elemental codes E and $E^{int}$ are composed of parity bits 1P, 2P and systematic bits U, $U^{int}$ as described above. Because the systematic bits $U^{int}$ of the second elemental code $E^{int}$ can be obtained by interlaving the systematic bits U of the first elemental code E, the actually transmitted data are the systematic bits U and the parity bits 1P of the first elemental code E and the parity bits 2P of the second elemental code $E^{int}$. The turbo codes are not limited to the parallel concatenated convolutional codes as described above and may be any codes which can be turbo-decoded by the decoding device 1, such as serial concatenated convolutional codes.

The first decoder 2 and the second decoder 3 are decoding sections which perform iterative decoding of the received data by soft-input soft-output decoding. SOVA and MAP are known as the soft-input soft-output decoding.

The MAP is described hereinafter by way of illustration. The first decoder 2 receives the received first elemental code E (first parity $Y_{1p}$, systematic bits $Y_s$) and external information $L_{e2}$. Based on these input values, the first decoder 2 performs decoding by the known soft-input soft-output decoding which generates soft-output using the value calculated by the forward processing and the backward processing in the trellis and outputs first external information $L_{e1}$. The interleaver (int) 4 interleaves the first external information $L_{e1}$ to generate interleaved first external information $L^{int}_{e1}$. At the same time, the interleaver 5 interleaves the systematic bits $Y_s$ to generate interleaved systematic bits $Y^{int}_s$, which is then supplied to the second decoder 3.

The second decoder 3 receives the interleaved first external information $L^{int}_{e1}$, the received second parity $Y_{2p}$, and the interleaved systematic bits $Y^{int}_s$. The second decoder 3 performs decoding by the known soft-input soft-output decoding, and outputs second external information $L^{int}_{e2}$. The second external information $L^{int}_{e2}$, is then de-interleaved by the de-interleaver 6 and supplied to the first decoder 2. Subsequently, the process that the first decoder 2 performs decoding using the second external information $L_2$ supplied from the de-interleaver 6 and the channel values (first parity $Y_{1p}$, systematic bits $Y_s$) and the second decoder 3 performs decoding using the interleaved first external information $L^{int}_{e1}$ and the channel value (second parity $Y_{2p}$) is repeated. One-time iterative decoding ends upon completion of the decoding process in the first decoder 2 and the second decoder 3.

In this embodiment, the first decoder 2 supplies logarithmic likelihood ratio $L_1$ which is generated in the process of decoding to the hard decision section 8. The second decoder 3 outputs logarithmic likelihood ratio $L^{int}_2$ which is generated in the process of decoding to the de-interleaver 7. The de-interleaver 7 de-interleaves the logarithmic likelihood ratio $L^{int}_2$ into logarithmic likelihood ratio $L_2$, and supplies it to the hard decision section 8. The hard decision section 8 determines a hard decision result $û(L_1)$ using the logarithmic likelihood ratio $L_1$ from the first decoder 2 and a hard decision result $û(L_2)$ using the logarithmic likelihood ratio $L_2$ from the second decoder 3. Further, in the decoding device 1 of this embodiment, the hard decision result $û(L_1)$ and $û(L_2)$ are supplied to the stop determination section 9, which then determines whether or not to stop the iterative process of turbo decoding.

The stop determination section 9 compares the BER which is calculated by HDA and the information length rate with thresholds and determines whether error detection of turbo codes is converged or not to thereby optimize the iterative number of turbo decoding.

Specifically, the stop determination section 9 calculates a determination value for stop determination and compares the value with a convergence determining threshold $\eta_{conv}$ or a non-convergence determining threshold $\eta_{non\text{-}conv}$ to thereby determine whether or not to stop the iterative decoding. A method of calculating the determination value is described hereinafter. Because the present embodiment detects convergence/non-convergence of the iterative decoding using the logarithmic likelihood ratios $L_1$ and $L_2$, it uses two determination values $\Delta_{0.5}$ and $\Delta_1$ as represented by Expressions 2 and 3 below:

$$\Delta_{0.5} = \sum_{k=0}^{N-1} |\hat{u}_k(L_1^i) - \hat{u}_k(L_2^{i-1})| \quad (2)$$

$$\Delta_1 = \sum_{k=0}^{N-1} |\hat{u}_k(L_1^i) - \hat{u}_k(L_2^i)| \quad (3)$$

where k indicates a bit identifier in block, i indicates an iterative number, N indicates a block length, û() indicates a hard decision result, $L_1$ indicates a logarithmic likelihood ratio LLR of the first decoder, $L_2$ indicates a logarithmic likelihood ratio LLR of the second decoder, and $\Delta$ indicates the ratios of differences in hard decision results.

The determination value $\Delta_{0.5}$ in Expression 2 indicates an average of differences between the current logarithmic likelihood ratio $L_1$ obtained by the first decoder 2 and the previous logarithmic likelihood ratio L obtained by the second decoder 3 for each bit. The determination value $\Delta_1$ in Expression 3 indicates an average of differences between the current logarithmic likelihood ratio $L_1$ obtained by the first decoder 2 and the current logarithmic likelihood ratio $L_2$ obtained by the second decoder 3 for each bit. If the determination values $\Delta_{0.5}$ and $\Delta_1$ approximate 0, the decoding result of the first decoder 2 and the decoding result of the second decoder 3 are equal. If the determination values $\Delta_{0.5}$ and $\Delta_1$ approximate 1, the decoding results of the decoders 2 and 3 differ largely, indicating that the decoding is not yet converged.

One-time iterative decoding ends after the decoding process is performed in the first decoder 2 and the second decoder 3. As shown in Expression 2, the timing to calculate the determination value $\Delta_{0.5}$ is not upon completion of normal iterative decoding but upon completion of decoding in the first decoder 12. Thus, the determination value $\Delta_{0.5}$ is calculated in the middle of the iterative decoding process in this embodiment. As shown in Expression 3, the determination value $\Delta_1$ is calculated upon completion of decoding in the second decoder 3. In this way, the present embodiment does not calculate the determination value for stop determination for each iterative decoding but calculates the determination values $\Delta_{0.5}$ and $\Delta_1$ at each timing when the decoding process in the decoders 2 and 3 ends. Accordingly, in this embodiment which uses two decoders, it is possible to perform the stop determination at a double rate. Accordingly, if there are two or more stages of decoders, the stop determination can be performed at more precise timings.

Figure 2:
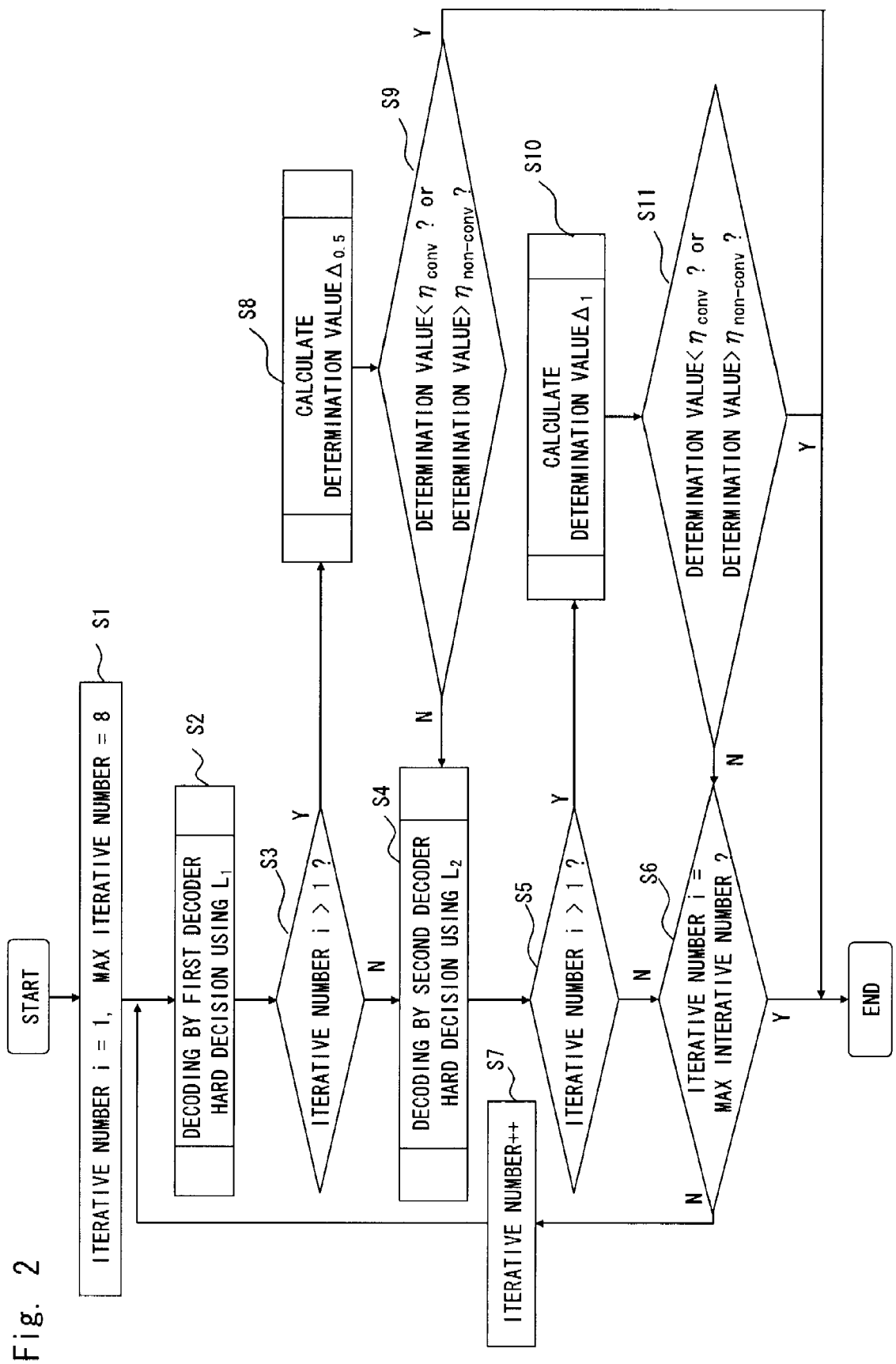
FIG. 2 is a flowchart showing a decoding method according to the first embodiment of the present invention.

The decoding method according to this embodiment is described hereinafter. FIG. 2 is a flowchart showing a decoding method according to this embodiment. In this example, a maximum number of times of iterative decoding in the decoders 2 and 3 is 8. As shown in FIG. 2, the process first sets the iterative number i=1 and the Max iterative number=8 (Step S1) and performs the decoding process in the first decoder 2. The decoding process in the first decoder 2 calculates the first external information $L_{e1}$ and the logarithmic likelihood ratio $L_1$ from the second external information $L_{e2}$, and the channel values $Y_{1p}$ and $Y_s$. The first external information $L_{e1}$ is supplied to the interleaver 4, interleaved thereby, and input to the second decoder 3. At the same time, the systematic bits $Y_s$ is interleaved by the interleaver 5 and input to the second decoder 3. An initial value of the second external information $L_{e2}$ to be input to the first decoder 2 is 0. The logarithmic likelihood ratio $L_1$ is supplied to the hard decision section 8.

The hard decision section 8 calculates a hard decision result $\hat{u}(L_1)$ using the logarithmic likelihood ratio $L_1$ (Step S2). If the current iterative number i is less than 1 (N in Step S3), the second decoder 3 executes a decoding process (Step S4). Specifically, the second decoder 3 receives the interleaved first external information $L^{int}_{e1}$, the channel value $Y_{1p}$, and the interleaved channel value $Y^{int}_s$, outputs the interleaved second external information $L^{int}_{e2}$ and the interleaved logarithmic likelihood ratio $L^{int}_2$. The interleaved second external information $L^{int}_{e2}$ is then de-interleaved by the de-interleaver 6 into the second external information $L_{e2}$ to be input to the first decoder 2. The interleaved logarithmic likelihood ratio $L^{int}_2$ is de-interleaved by the de-interleaver 7 into the logarithmic likelihood ratio $L_2$ and supplied to the hard decision section 8. The hard decision section 8 uses the logarithmic likelihood ratio $L_2$ to calculate a hard decision result $\hat{u}(L_2)$. The hard decision result $\hat{u}(L_2)$ is stored in a memory which is placed in the hard decision section 8 or the stop determination section 9, or a separate memory (not shown).

Then, if the current iterative number i is less than 1 (N in Step S5), it is determined whether the iterative number is a maximum number=8 or not (Step S6). If no, the iterative number i is incremented (Step S7) and the process repeats from Step S2.

If the current iterative number reaches 2, the decoding process is performed similarly in Step S2 to calculate a hard decision result $\hat{u}(L^2_1)$. The hard decision result $\hat{u}(L^2_1)$ is stored in the memory in the hard decision section 8.

Then, the iterative number is determined to be larger than 1 (Y in Step S3), and the stop determination section 9 calculates the determination value $\Delta_{0.5}$ (Step S8). In this step, the determination value $\Delta_{0.5}$ is calculated from Expression 2 based on the hard decision result $\hat{u}(L^2_1)$ which is calculated in Step S2 and stored and a hard decision result $\hat{u}(L^1_2)$ which is calculated in Step S5 in the previous iterative decoding process and stored in a memory. Then, it is determined whether the determination value $\Delta_{0.5}$ is smaller than the convergence determining threshold $\eta_{conv}$ (i.e. convergence) or larger than the non-convergence determining threshold $\eta_{non\text{-}conv}$ (i.e. non-convergence) and, if value satisfies either convergence or non-convergence conditions, the process ends.

If, on the other hand, the value does not satisfy neither convergence nor non-convergence conditions (N in Step S9), the decoding is performed similarly in Step S4 to calculate a hard decision result $\hat{u}(L^2_2)$ and store it in a memory. After Step S5, the process calculates the determination value $\Delta_1$ (Step S10). In this step, the determination value $\Delta_1$ is calculated from Expression 3 based on the hard decision result $\hat{u}(L^2_1)$ in the current iterative decoding which is calculated in Step S2 and stored and the hard decision result $\hat{u}(L^2_2)$ also in the current iterative decoding which is calculated in Step S4 and stored. The process then determines whether the determination value $\Delta_1$ is smaller than the convergence determining threshold $\eta_{conv}$ (i.e. convergence) or larger than the non-convergence determining threshold $\eta_{non-conv}$ (i.e. non-convergence) (Step S11) and, if value satisfies either convergence or non-convergence conditions, the process ends.

In this way, the process repeats the procedure from Step S2 until the determination value $\Delta_{0.5}$ or $\Delta_1$ satisfies the convergence or non-convergence conditions or the iterative maximum number (=8) is reached. The values of the thresholds $\eta_{conv}$ and $\eta_{non-conv}$ may be predetermined appropriately by simulation or the like in accordance with the communication environments such as the condition of a transmission line and a transmission rate, a required BER, the number of times of iterative decoding, the configuration of a decoder, and so on.

In this embodiment, upon completion of the decoding by the first decoder 2, the determination on convergence/non-convergence is performed using the determination value $\Delta_{0.5}$. Further, upon completion of the decoding by the second decoder 3, which is upon completion of normal one-time iterative decoding process, the determination on convergence/non-convergence is performed using the determination value $\Delta_1$. This enables performing double number of times of stop determination. It is thereby possible to reduce the iterative process by 0.5/2 times on average, theoretically.

Second Embodiment

A second embodiment of the present invention is described hereinafter. In this embodiment, the first decoder and the second decoder in the first embodiment are integrated into one decoder (decoding processor).

Figure 3:
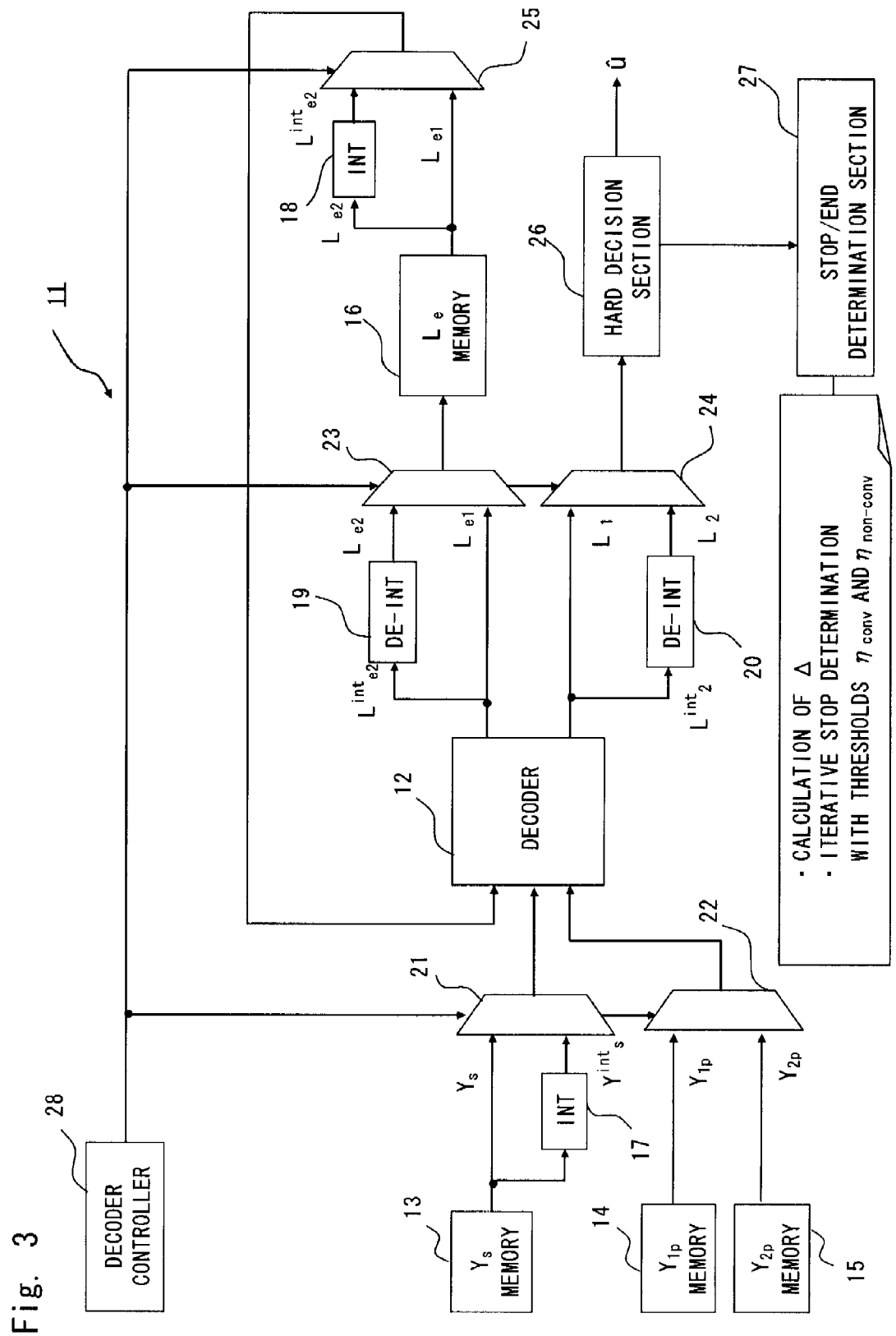
FIG. 3 is a block diagram showing a decoding device according to a second embodiment of the present invention.

FIG. 3 is a block diagram showing a decoding device according to this embodiment. The decoding device 11 includes a decoder 12 and memories 13 to 16 which store channel values $Y_s$, $Y_{1p}$, $Y_{2p}$, and external information $L_e$, respectively. The decoding device 21 also includes interleavers 17 and 18, de-interleavers 19 and 20, selectors 21 to 25, a hard decision section 26, a stop determination section 27, and a decoder controller 28.

The decoder 12 carries out the functions of the first decoder and the second decoder shown in FIG. 1. Accordingly, the selector 21 switches the selection between the output from the $Y_s$ memory 13 and the output from the $Y_s$ memory 13 which is interleaved by the interleaver 17 so that the selected one is input to the decoder 12. Further, the selector 22 switches the selection between the output from the $Y_{1p}$ memory 14 and the output from the $Y_{2p}$ memory 15 so that the selected one is input to the decoder 12.

The decoder 12 outputs the first external information $L_{e1}$ or the interleaved second external information $L^{int}_{e2}$. The first external information $L_{e1}$ is input to the selector 23 as it is, while the interleaved second external information $L^{int}_{e2}$ is input to the selector 23 after de-interleaved by the de-interleaver 19. The selector 23 selects either one and stores the selected value in the $L_e$ memory 15. The decoder 12 also outputs the logarithmic likelihood ratios $L_1$ and $L^{int}_2$. The logarithmic likelihood ratio $L_1$ is input to the selector 24 as it is, while the interleaved logarithmic likelihood ratio $L^{int}_2$ is input to the selector 24 after de-interleaved by the de-interleaver 20. The selector 24 selects either one and supplies the selected value to the hard decision section 26. The stop determination section 27 calculates the determination values $\Delta_{0.5}$ and $\Delta_1$ as described above based on the hard decision result in the hard decision section 26.

The $L_e$ memory 16 outputs $L_{e1}$ and $L_{e2}$. The output $L_{e1}$ is interleaved by the interleaver 18 and input to the selector 25. The selector 25 selects either the second external information $L_{e2}$ or the interleaved first external information $L^{int}_{e1}$ and supplies the selected one to the decoder 12.

The decoding method of the decoding device 11 is substantially the same as the method in the first embodiment shown in FIG. 2. The selectors 21 to 25 switch appropriately according to the control of the decoder controller 28, so that the decoder 12 operates as the first decoder or as the second decoder.

Firstly, the decoder 12 functions as the first decoder. Under the control of the decoder controller 28, the channel values (systematic bits $Y_s$, parity bits $Y_{1p}$) from the $Y_s$ memory 13 and the $Y_{1p}$ memory 14, respectively, are supplied to the decoder 12 through the selectors 21 and 22. Further, the second external information $L_{e2}$ is supplied to the decoder 12 through the $L_e$ memory 16 and the selector 25. At the first iterative decoding, the external information $L_{e2}$ is set to 0. Based on these values, the decoder 12 outputs the external information $L_{e1}$ and the logarithmic likelihood ratio $L_1$.

The first external information $L^{e1}$ is supplied to the $L_e$ memory 16 through the selector 23, interleaved by the interleaver 18, and then supplied to the decoder 12 through the selector 25. At the same time, $Y_s$ from the $Y_s$ memory 13 is interleaved into $Y^{int}_s$ by the interleaver 17 and supplied to the decoder 12 through the selector 21. Further, $Y_{2p}$ from the $Y_{2p}$ memory 15 is supplied to the decoder 12 through the selector 22. Receiving these values, the decoder 12 now functions as the second decoder and outputs the second external information $L^{int}_{e2}$ and the logarithmic likelihood ratio $L^{int}_2$. The second external information $L^{int}_{e2}$ is de-interleaved by the de-interleaver 19, stored in the $L_e$ memory 16 through the selector 23, and then supplied to the decoder 12 through the selector 25 at an appropriate timing. In this way, the decoder 12 sequentially performs the decoding process as the first decoder and the decoding process as the second decoder in an alternative manner.

On the other hand, the logarithmic likelihood ratio $L_1$ which is calculated in the decoding process performed as the first decoder is supplied to the hard decision section 26 through the selector 24. The hard decision section 26 calculates a hard decision result using the logarithmic likelihood ratio $L_1$. Then, the decoder 12 performs the decoding process as the second decoder and calculates the logarithmic likelihood ratio $L^{int}_2$. The logarithmic likelihood ratio $L^{int}_2$ is de-interleaved by the de-interleaver 20 and supplied to the hard decision section 26 through the selector 24. The hard decision section 26 calculates a hard decision result using the logarithmic likelihood ratio $L_2$.

The hard decision result calculated from the logarithmic likelihood ratio $L_1$ and the hard decision result calculated from the logarithmic likelihood ratio $L_2$ are sequentially supplied to the stop determination section 27 at intervals of the iterative number of 0.5. The stop determination section 27 uses these values to calculate the determination values $\Delta_{0.5}$ and $\Delta_1$ from Expressions 2 and 3 at the timings of the iterative number of 0.5 and 1, respectively, and compares these values with the convergence determining threshold $\eta_{conv}$ and the non-convergence determining threshold $\eta_{non-conv}$ for the stop determination. This process is the same as in the first embodiment.

This embodiment has the same advantages as the first embodiment. By performing the stop determination not in each iterative decoding but in each decoding process in a decoder, it enables more precise timings for stop determination and earlier detection of convergence/non-convergence by a maximum 0.5 times of the iterative decoding number, theoretically. Further, this embodiment integrates the first and second decoders into one decoder, which reduces a circuit size.

Figure 4:
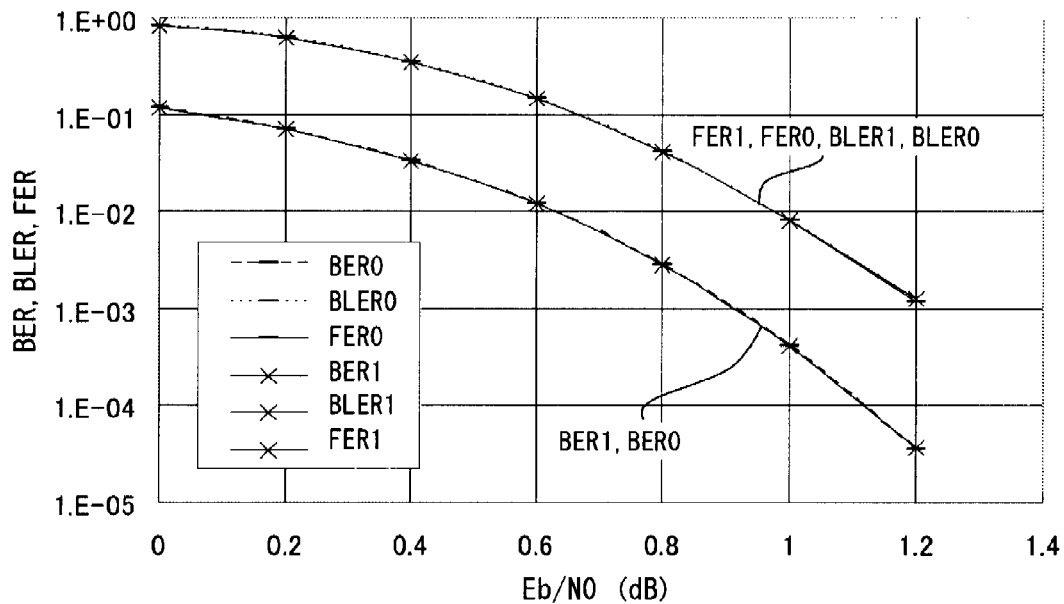
FIG. 4 is a view to describe advantages of the present invention, which is a graph indicating a bit error rate (BER), a block error rate (BLER), and a frame error rate (FER) with respect to a signal-to-noise power density ratio ($E_b/N_0$)
Figure 5:
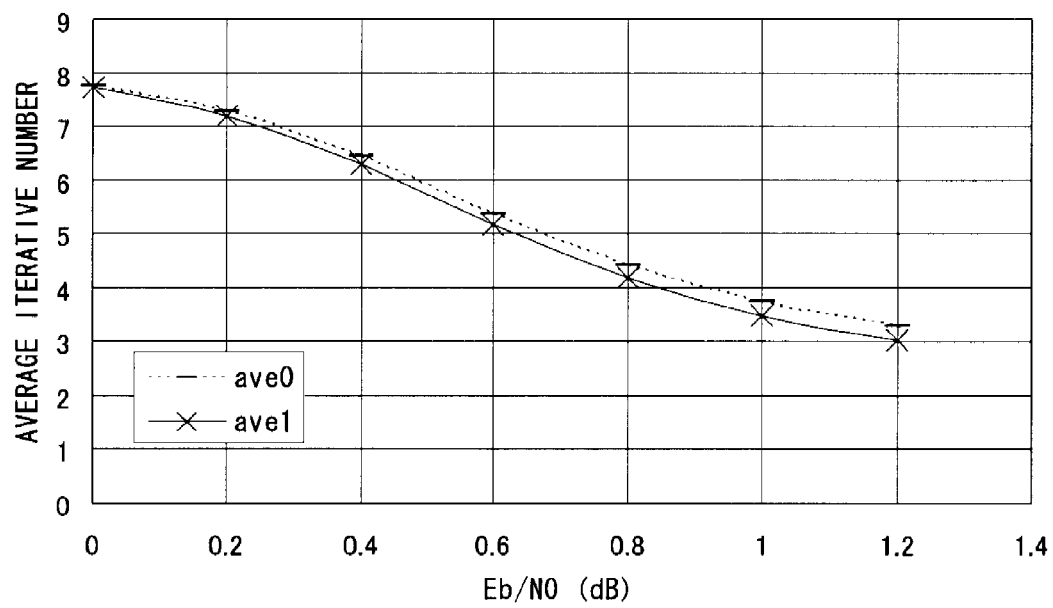
FIG. 5 is a view to describe advantages of the present invention, which is a graph indicating an average iterative number with respect to a signal-to-noise power density ratio ($E_b/N_0$)

Advantages of the present invention are described hereinafter based on the simulation results of an example to which the present invention is applied and a comparative example to which a conventional stop method is applied. FIG. 4 is a graph indicating a bit error rate (BER), a block error rate (BLER) and a frame error rate (FER) with respect to a signal-to-noise power density ratio ($E_b/N_0$). FIG. 5 is a graph indicating an average iterative number with respect also to a signal-to-noise power density ratio ($E_b/N_0$).

In FIG. 4, the BER in the vertical axis indicates the number of error bits with respect to a total number of bits (error bit number/total bit number). The BLER indicates an error rate in a transport block. In this example, one frame contains one block, and one block contains 656 bits. The FER indicates the number of error frames with respect to a total number of frames (error frame number/total frame number). Because one frame corresponds to one transport block in this example, the FER is synonymous with the BLER. If one frame contains a plurality of transport blocks, the FER is a different value from the BLER. The signal-to-noise power density ratio ($E_b/N_0$) in the horizontal axis indicates a power per bit (Eb) with respect to a power of noise ($N_0$). As the amount of noises is larger, the value of the signal-to-noise power density ratio is smaller.

In FIGS. 4 and 5, BER1, BLER1, FER1, and ava1 correspond to the application of the present invention, and BER0, BLER0, FER0, and ava0 correspond to the application of the related art. As shown in FIG. 4, FER1, FER0, BLER1 and BLER0 substantially overlap, and BER1 and BER0 also substantially overlap. Thus, there is no difference in error correction capacity between the case of performing the stop determination once per substantially 0.5 times of iterative decoding by applying the present invention so as to detect convergence or not to thereby optimize the iterative decoding number and the case of performing the stop determination once per every iterative decoding as normal so as to detect convergence/non-convergence to thereby optimize the iterative decoding number.

On the other hand, the average iterative number is smaller in the example of the present invention (ava1) than in the related art (ava0) as shown in FIG. 5. In this simulation, under the condition of BLER=0 ($E_b/N_0$=1.0 dB), the iterative number can be reduced by about 0.25 times. Further, under the condition of $E_b/N_0$=1.2 dB, the iterative number can be reduced by about 0.26 times. Consequently, the application of the decoding method of the present invention enables reduction in the number of times of iterative decoding in each code block while maintaining high error correction capacity.

Figure 6:
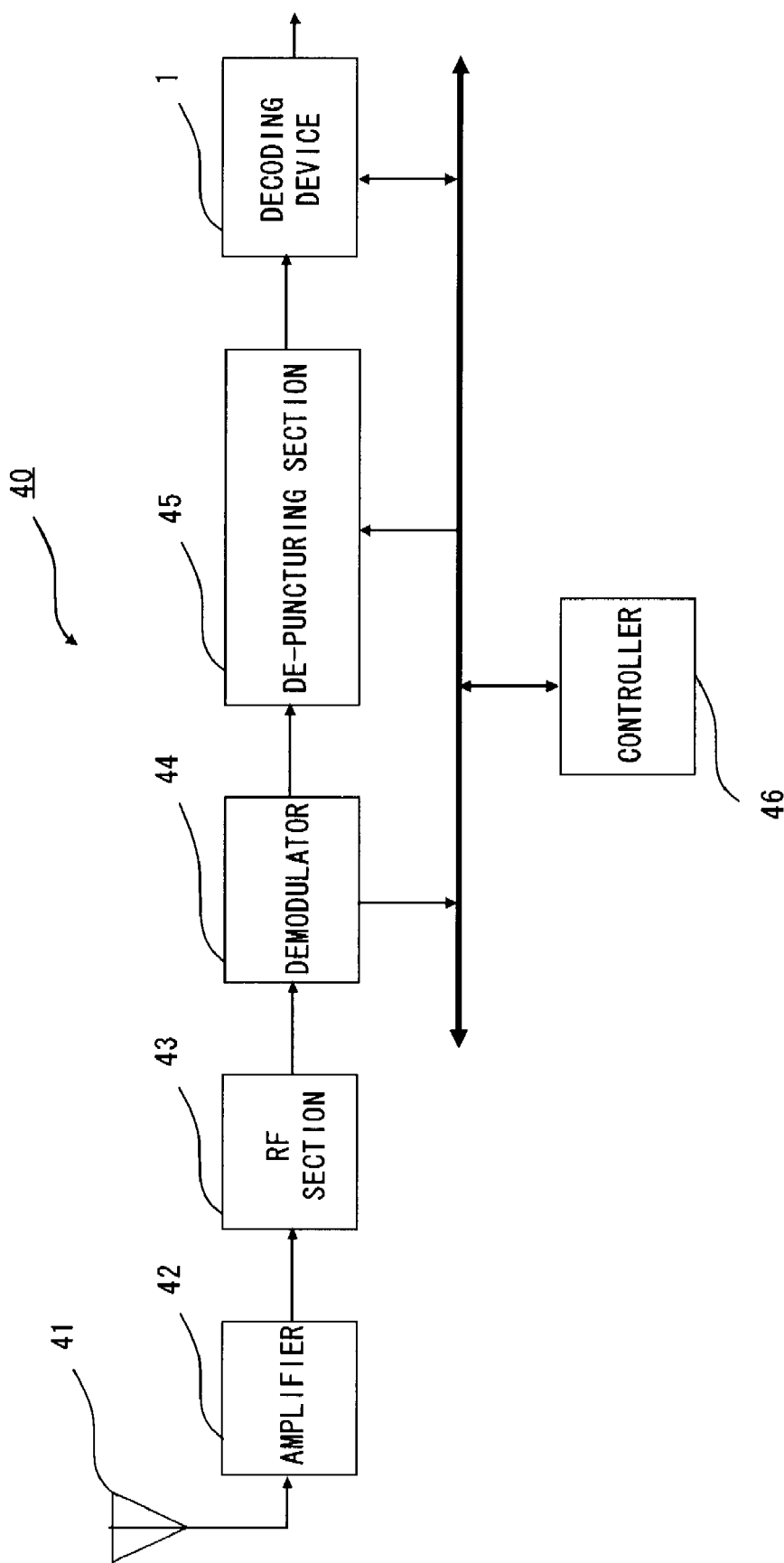
FIG. 6 is a view showing a receiving apparatus including a decoding device according to an embodiment of the present invention.
Figure 7:
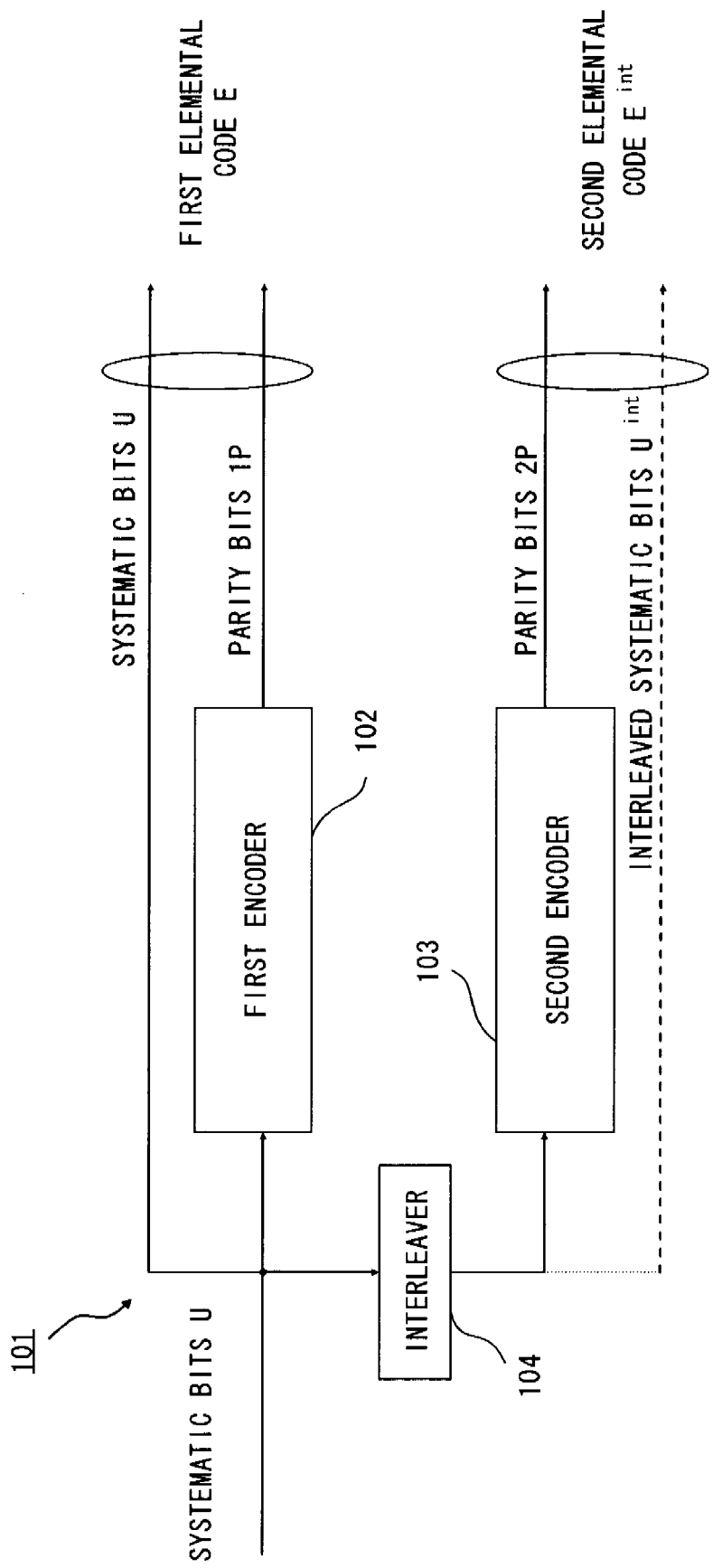
FIG. 7 is a view showing the structure of a typical encoding device for generating turbo codes.
Figure 8:
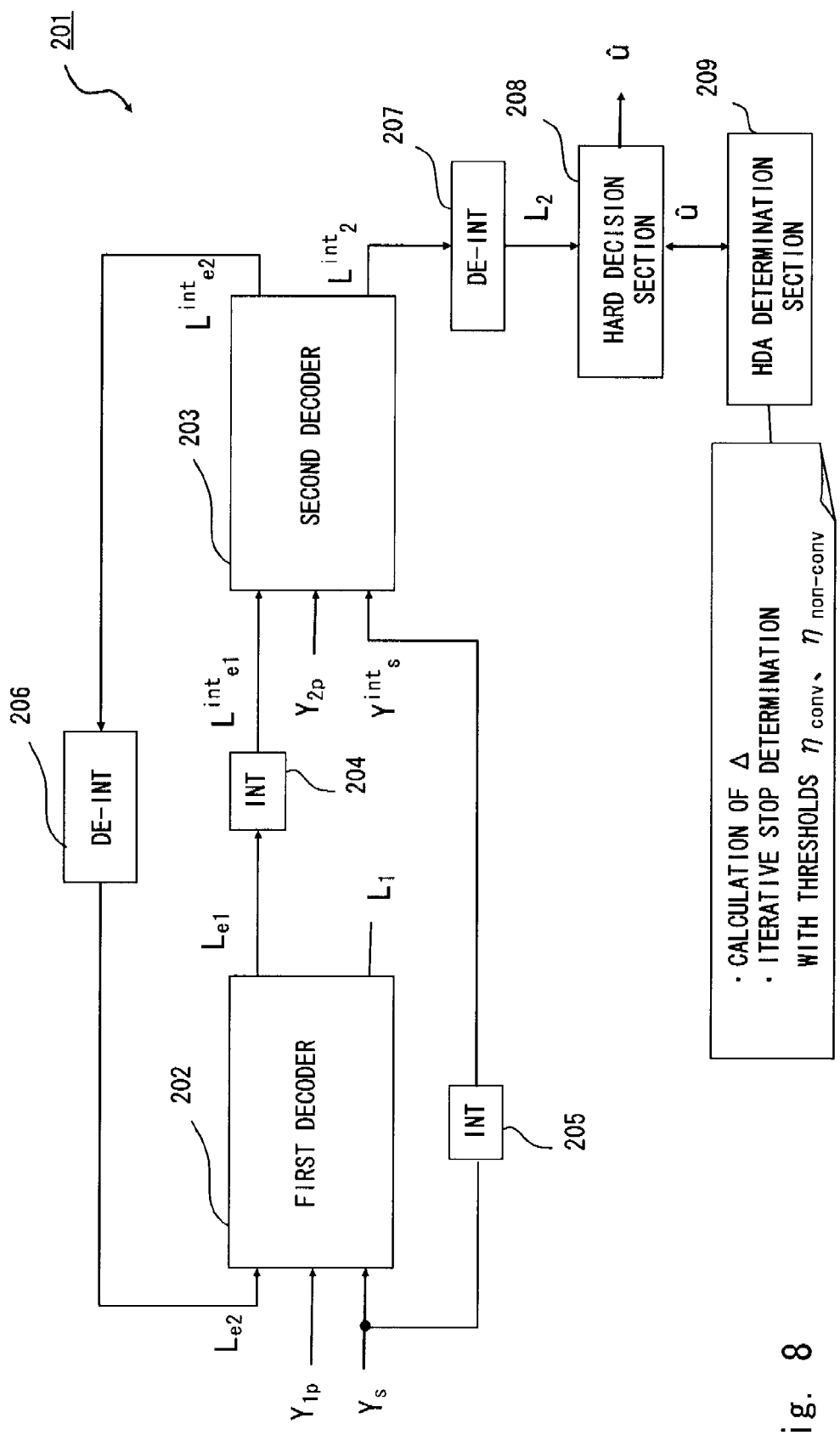
FIG. 8 is a block diagram showing a decoding device according to a related art.
Figure 9:
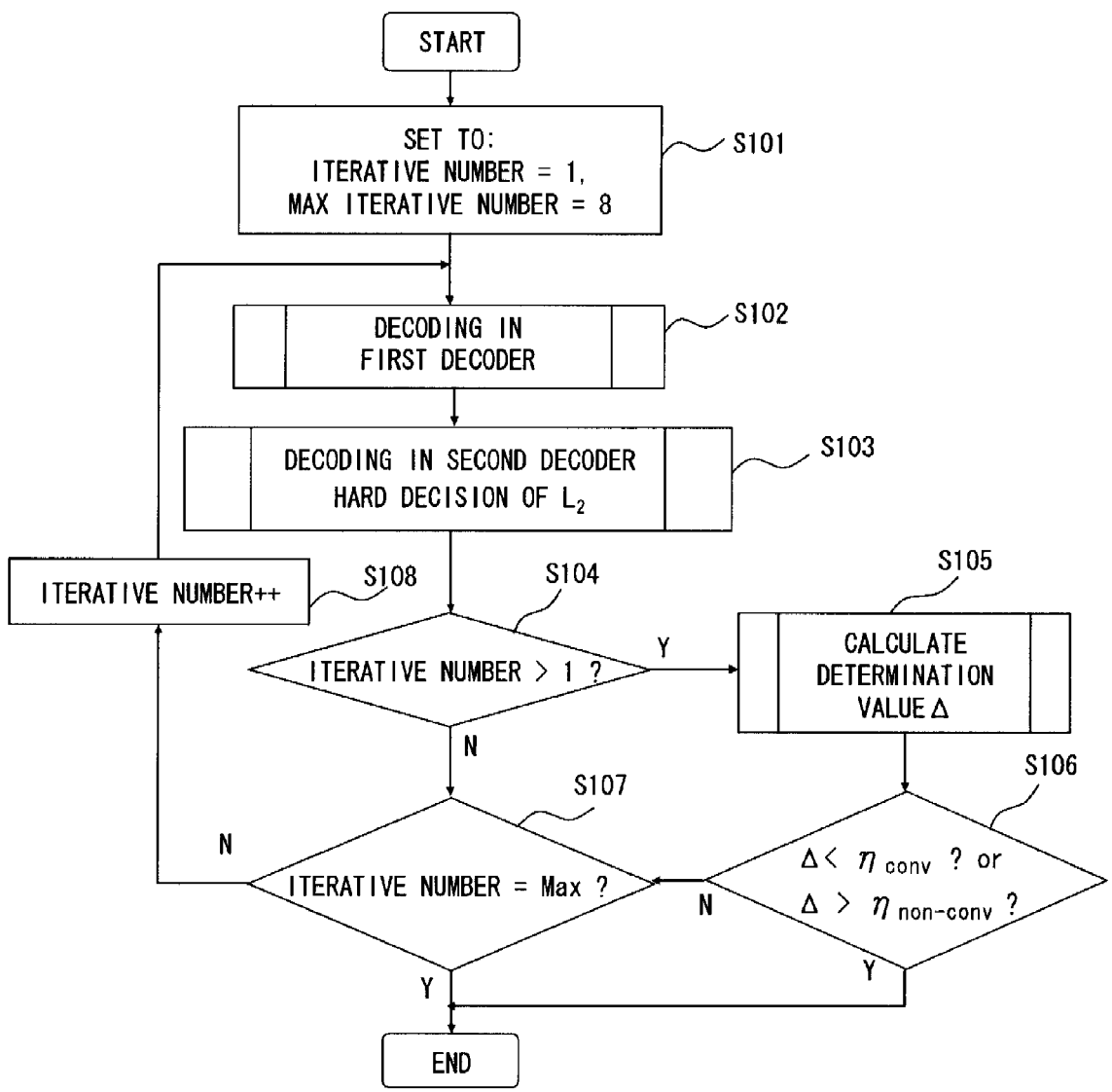
FIG. 9 is a flowchart showing a decoding method for a decoding device according to a related art.

An exemplary receiving apparatus which includes the decoding device according to the first or the second embodiment is described hereinbelow. FIG. 6 is a view showing the receiving apparatus which includes the above-described decoding device. In addition to the decoding device 1, the receiving apparatus 40 includes an antenna 41, an amplifier 42, an RF section 43, a demodulator 44, a de-puncturing section 45, a controller 46 for controlling these elements and so on as shown in FIG. 6.

In the receiving apparatus 40, the received data received by the antenna 41 is supplied to the amplifier 42. The amplifier 42 amplifies the received data and supplies the amplified data to the RF section 43. The RF section 43 performs high frequency processing such as high frequency conversion and supplies the processed received data to the demodulator 44 for demodulation. The demodulated received data is then supplied to the de-puncturing section 45. The de-puncturing section 45 performs the de-interleaving which is reverse to the interleaving performed in the transmitting side to thereby restore the original data sequence and further performs the de-puncturing which inserts O-bit to the position of data which is eliminated upon transmission to thereby restore the original data length. The data having the original data length as a result of the de-puncturing is supplied to the decoding device 1 for turbo decoding to thereby obtain a hard decision decoding result. The controller 46 controls the timing to supply data to the decoding device 1 based on the stop determination results in the decoding device 1, for example.

In the receiving apparatus having such a configuration, the presence of the decoding device 1 enables the convergence determination on received data at a smaller iterative decoding number. This enables the provision of a high-speed receiving apparatus with reduced power consumption.

The present invention is not limited to the above-described embodiments but may be altered in various ways without departing from the scope of the invention. For example, although the above-described first and second embodiments use Expressions 2 and 3 to calculate a determination value, it is not limited thereto. For instance, Expression 3 may be any value which can be calculated at the timing upon completion of the first iterative decoding step, and it is possible to use Expression 1 below as in conventional HDA.

$$\Delta_0 = \frac{1}{N} \sum_{k=0}^{N-1} |\hat{u}_k(L_2^i) - \hat{u}_k(L_2^{i-1})| \quad (1)$$

Further, the determination value $\Delta_{0.5}$ which is represented by Expression 2 may be any value which can be calculated at the timing upon completion of the decoding process in the first decoder, and it is possible to use the external information $L_{e1}$ and $L_{e2}$ rather than the logarithmic likelihood ratios $L_1$ and $L_2$. Furthermore, although Expression 1 uses the result of the second decoder, if the decoding begins with the second decoder and the iterative decoding ends with the first decoder, it is possible to use the output $L_1$ from the first decoder to calculate a determination value. Although the left part of Expressions 1 to 3 is multiplied with 1/N, it is possible to multiply the threshold η with N instead. It is also possible to compare the minimum/maximum $L_1$ or $L_2$ with thresholds, in addition to the determination values $\Delta_0$, $\Delta_{0.5}$ and $\Delta_1$. It is further possible to use the minimum/maximum $L_1$ or $L_2$, $L_{e1}$, $L_{e2}$ in the different or same positions at which the code bits differ in hard decision results or SCR.

In the above-described embodiments, the decoding device which performs turbo decoding using the decoding results in the two decoders or the two stages of decoding process is described. However, a decoding device may include two or more decoders or may have three or more stages of decoding functions. In such a case, if the number of decoders=M, with the use of Expression 2, the determination value Δ can be calculated using a part or all of the results of the first and the second decoders, the results of the second and the third decoders, ..., the results of the (M−1)th and the Mth decoders. This enables the stop determination with more precise units, not with a unit of iterative decoding, to thereby stop the process with a minimum iterative number.

Although convergence/non-convergence is determined using two thresholds in the above-described embodiments, it is possible to determine only convergence, for example. Further, the thresholds $η_{conv}$ or $η_{non-conv}$ may be constant numbers or variable numbers which vary with the iterative number. In such a case, the value may be calculated appropriately by function or stored in a look-up table or the like.

Further, in these embodiments which enable convergence/non-convergence determination with short intervals, it is possible to perform CRC determination after the stop determination and upon detecting CRC error, it is possible to perform the iterative decoding again.

In addition, although the above-described embodiments are described as hardware configuration, the present invention may be implemented by executing a computer program on a CPU (Central Processing Unit) to thereby perform arbitrary processing. In such a case, a computer program may be stored in a recording medium or may be transmitted through a transmission medium such as the Internet.

It is apparent that the present invention is not limited to the above embodiment that may be modified and changed without departing from the scope and spirit of the invention.

What is claimed is:

1. A decoding device that decodes received data based on likelihood information, comprising:
    a decoding processor to function as a plurality of stages of decoders, performing iterative decoding on the received data and completing one-time iterative decoding by executing decoding process in first to final stages of the decoders; and
    a stop determination section performing stop determination on whether or not to stop the iterative decoding based on an output result from the decoding processor and executing the stop determination at a timing of completion of decoding process before the final stage.

2. The decoding device according to claim 1, wherein the stop determination section performs the stop determination at a timing of completion of each decoding process in the plurality of stages of decoding process.

3. The decoding device according to claim 1, wherein the decoding processor includes a plurality of stages of decoders, and
    the stop determination section performs the stop determination based on decoding results in previous and subsequent decoders of the plurality of stages of decoders.

4. The decoding device according to claim 1, further comprising:
    a hard decision section outputting a hard decision decoding result based on a decoding result of the decoding processor,
    wherein the stop determination section determines convergence/non-convergence of error correction in the received data based on a result of the hard decision section and performs the stop determination in accordance with a result of the determination.

5. The decoding device according to claim 1, wherein the decoding processor includes a first decoder and a second decoder, and
    the stop determination section performs the stop determination based on an output from the first decoder in current iterative decoding and an output from the second decoder in previous iterative decoding.

6. The decoding device according to claim 5, further comprising:
    a hard decision section outputting a hard decision decoding result based on a decoding result of the decoding processor,
    wherein the stop determination section performs the stop determination based on a result of the hard decision section by calculating a determination value corresponding to the number of differences in hard decision results based on an output from the first decoder in current iterative decoding and an output from the second decoder in previous iterative decoding and detecting convergence/non-convergence using the determination value.

7. The decoding device according to claim 1, wherein the decoding processor includes a first decoder and a second decoder, and
    the stop determination section performs the stop determination based on outputs of the first decoder and the second decoder in current iterative decoding.

8. The decoding device according to claim 1, wherein the decoding processor includes a first decoder and a second decoder, and
    the stop determination section performs the stop determination based on outputs of the first decoder or the second decoder in current iterative decoding and previous iterative decoding.

9. The decoding device according to claim 1, further comprising:
    a controller controlling the decoding processor,
    wherein the decoding processor includes one decoder to function as a first decoder and a second decoder, and
    the controller switches an input to the one decoder such that the one decoder functions as the first decoder or the second decoder.

10. A decoding method that decodes received data based on likelihood information, comprising:
    performing iterative decoding on the received data by a decoding processor functioning as a plurality of stages of decoders and completing one-time iterative decoding by executing first to final stages of decoding process; and
    performing stop determination on whether or not to stop current iterative decoding based on a result of decoding process before the final stage in the decoding processor presently executing current iterative decoding.

11. The decoding method according to claim 10, wherein the stop determination is executed at a timing of completion of each decoding process in the plurality of stages of decoding process.

12. The decoding method according to claim 10, wherein the iterative decoding is performed by a plurality of stages of decoders, and
    the stop determination is performed based on decoding results of previous and subsequent decoders of the plurality of stages of decoders.

13. The decoding method according to claim 10, comprising:
    calculating a hard decision decoding result based on a decoding result of the decoding processor,
    wherein the stop determination performs stop determination on whether or not to stop current iterative decoding in accordance with a determination result on convergence/non-convergence of error correction in the received data based on the hard decision decoding result.

14. The decoding method according to claim 10, wherein the iterative decoding is performed by a first decoder and a second decoder, and
    the stop determination performs stop determination on whether or not to stop current iterative decoding based on an output from the first decoder in current iterative decoding and an output from the second decoder in previous iterative decoding.

15. The decoding method according to claim 14, comprising:
    calculating a hard decision decoding result based on a decoding result from the decoding processor, wherein the stop determination performs stop determination on whether or not to stop current iterative decoding based on the hard decision decoding result by calculating a determination value corresponding to the number of differences in hard decision results based on an output from the first decoder in current iterative decoding and an output from the second decoder in previous iterative decoding and detecting convergence/non-convergence using the determination value.

16. The decoding method according to claim 10, wherein the iterative decoding is performed by a first decoder and a second decoder, and the stop determination performs stop determination on whether or not to stop current iterative decoding based on outputs of the first decoder and the second decoder in current iterative decoding.

17. The decoding method according to claim 10, wherein the iterative decoding is performed by a first decoder and a second decoder, and the stop determination performs stop determination on whether or not to stop current iterative decoding based on outputs of the first decoder or the second decoder in current iterative decoding and previous iterative decoding.

18. A receiving apparatus that performs iterative decoding of received data based on likelihood information, comprising:

a receiver receiving the received data composed of concatenated codes;

a decoding processor to function as a plurality of stages of decoders, performing iterative decoding on the received data and completing one-time iterative decoding by executing decoding process in first to final stages of decoders; and a stop determination section performing stop determination on whether or not to stop the iterative decoding based on an output result from the decoding processor and executing the stop determination at a timing of completion of decoding process before the final stage.

* * * * *

UNITED STATES PATENT AND TRADEMARK OFFICE
CERTIFICATE OF CORRECTION

| | |
|---|---|
| PATENT NO. | : 7,886,209 B2 |
| APPLICATION NO. | : 11/622780 |
| DATED | : February 8, 2011 |
| INVENTOR(S) | : Masao Orio |

Page 1 of 1

It is certified that error appears in the above-identified patent and that said Letters Patent is hereby corrected as shown below:

Column 2, Line 11: delete "$L_4$" and insert -- $L_{e2}$ --

Column 2, Line 46: delete "26" and insert -- $26^{th}$ --

Column 8, Line 42: delete "$L^{int}_{e2}$," and insert -- $L^{int}_{e2}$ --

Column 12, Line 12: delete "$Y_s$," and insert -- $Y_s$, --

Column 12, Line 20: delete "$L^{e1}$" and insert -- $L_{e1}$ --

Column 12, Line 25: delete "$Y_{2p}$," and insert -- $Y_{2p}$ --

Column 14, Line 5: delete "O-bit" and insert -- 0-bit --

Signed and Sealed this
First Day of January, 2013

David J. Kappos
*Director of the United States Patent and Trademark Office*